US007679354B2

(12) United States Patent
Shin

(10) Patent No.: US 7,679,354 B2
(45) Date of Patent: Mar. 16, 2010

(54) PHASE DETECTING DEVICE, PHASE CONTROL DEVICE INCLUDING THE PHASE DETECTING DEVICE, AND FUSER CONTROL DEVICE INCLUDING THE PHASE CONTROL DEVICE

(75) Inventor: Bong-su Shin, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 244 days.

(21) Appl. No.: 11/734,554

(22) Filed: Apr. 12, 2007

(65) Prior Publication Data

US 2008/0024107 A1 Jan. 31, 2008

(30) Foreign Application Priority Data

Jul. 28, 2006 (KR) ..................... 10-2006-0071783

(51) Int. Cl.
*G05F 1/445* (2006.01)
*H03K 17/13* (2006.01)

(52) U.S. Cl. ...................... 323/325; 323/239; 327/451; 219/499; 219/507

(58) Field of Classification Search ................. 323/235, 323/237, 239, 241, 242, 243, 244, 246, 300, 323/320, 324, 325, 902; 327/446, 452, 455, 327/456, 469, 476, 451; 219/482, 490, 494, 219/495, 497, 499, 501, 506, 507; 399/69, 399/88

See application file for complete search history.

(56) References Cited

U.S. PATENT DOCUMENTS 6,943,326 B2 * 9/2005 Hirst .......................... 219/492
7,295,789 B2 * 11/2007 Inukai ......................... 399/67

FOREIGN PATENT DOCUMENTS

| | | |
|---|---|---|
| EP | 0 875 804 | 11/1998 |
| EP | 0 889 674 | 1/1999 |
| JP | 10-74023 | 3/1998 |
| JP | 2001-237048 | 8/2001 |
| JP | 2002-304085 | 10/2002 |

OTHER PUBLICATIONS

English Translation of JP 2001-237048, Canon, Aug. 31, 2001.*
English Translation of JP 2002-304085, Richoh, Oct. 18, 2002.*
Extended European Search Report issued Nov. 16, 2007 by the European Patent Office with respect to European Patent Application No. 07107738.2 filed on May 8, 2007.

* cited by examiner

*Primary Examiner*—Gary L Laxton
(74) *Attorney, Agent, or Firm*—Staas & Halsey LLP

(57) ABSTRACT

A phase detecting device includes a power input unit that receives an AC voltage; a phase detector that detects zero-crossing points of the AC voltage, and outputs a phase detecting signal when the zero-crossing points of the AC voltage are detected; and a power switch that selectively cuts off a flow of AC into the power input unit in response to a mode control signal.

31 Claims, 9 Drawing Sheets

PHASE DETECTING DEVICE, PHASE CONTROL DEVICE INCLUDING THE PHASE DETECTING DEVICE, AND FUSER CONTROL DEVICE INCLUDING THE PHASE CONTROL DEVICE

CROSS-REFERENCE TO RELATED APPLICATIONS

This application claims the benefit of Korean Patent Application No. 2006-71783 filed on Jul. 28, 2006, in the Korean Intellectual Property Office, the disclosure of which is incorporated herein by reference in its entirety.

BACKGROUND OF THE INVENTION

1. Field of the Invention

Aspects of the invention relate to a phase detecting device, a phase control device including the phase detecting device, and a fuser control device including the phase control device. More particularly, aspects of the invention relate to a phase detecting device that accurately detects zero-crossing points of an alternating current (AC) voltage in a normal mode, and reduces electric power consumption in a standby mode, a phase control device including the phase detecting device, and a fuser control device including the phase control device.

2. Description of the Related Art

An image forming apparatus, such as a printer, a photocopier, a facsimile machine, and a multifunction device combining the functionality of several different pieces of office equipment into a single machine, is a device for printing an image on a print medium by executing a print operation corresponding to input data.

Generally, an image forming apparatus requires a heating device in order to execute a print operation properly, and a device for maintaining the temperature of such a heating device at a predetermined temperature. A fuser for fixing a toner image formed on a print medium requires a fuser control device in order to maintain the surface temperature of the fuser at a predetermined temperature appropriate for the toner image to be fixed on the print medium.

A phase controlling method for controlling AC input power has been extensively used in a fuser control device in the related art. In order to apply the phase controlling method, a phase detecting device for detecting zero-crossing points of an AC input voltage is required. Zero-crossing points of an AC voltage are points where the waveform of the AC voltage crosses a zero voltage level as the polarity of the AC voltage changes from positive to negative, or from negative to positive.

FIG. 8 is a circuit diagram of an example of a phase detecting device according to the related art.

Referring to FIG. 8, a phase detecting device 10 includes a power input unit 12 through which an AC voltage is input, and a phase detecting unit 14.

The power input unit 12 includes resistors R21, R22, R23, and R24 which divide the AC voltage and output a divided AC voltage.

The phase detecting unit 14 includes a first phase detector 14-1 and a second phase detector 14-2 which detect zero-crossing points of the AC voltage according to positive and negative polarities of the AC voltage based on the divided AC voltage outputted from the power input unit 12. That is, the first phase detector 14-1 detects zero-crossing points of a positive polarity of the AC voltage, and the second phase detector 14-2 detects zero-crossing points of a negative polarity of the AC voltage.

The first and second phase detectors 14-1, 14-2 include photocouplers including first and second light-emitting elements D11, D12 activated by the divided AC voltage to emit light, and first and second light-receiving elements PT11, PT12 respectively corresponding to the first and second light-emitting elements D11, D12 which are connected to an external DC voltage (Vcc11) through a resistor R25 and are activated in response to the light emitted from the first and second light-emitting elements D11, D12.

The phase detecting unit 14 further includes a switching element TR11 which is connected to the external DC voltage (Vcc11) through a resistor R26 and is turned on and off according to the activation of the first and second light-receiving elements PT11, PT12.

The operation of the phase detecting device shown in FIG. 8 according to the related art will now be described.

FIG. 9 is a diagram for explaining the operation of the phase detecting device shown in FIG. 8 according to the related art.

Referring to FIGS. 8 and 9, an AC voltage is input and divided through the power input unit 12, and alternately flows into the first and second phase detectors 14-1, 14-2. That is, the positive polarity of the divided AC voltage flows into the first phase detector 14-1, and the negative polarity of the divided AC voltage flows into the second phase detector 14-2.

For instance, a positive AC voltage is inputted to the first light-emitting element D11 of the first phase detector 14-1, and activates the first light-receiving element PT11. Since the first light-receiving element PT11 is activated by the AC voltage, a current path is formed between the external DC voltage (Vcc11) and a ground voltage (indicated by an inverted triangle in the FIG. 8) through the resistor R25 and the first light-receiving element PT11, thereby causing a voltage of a first node N11, at which the external DC voltage (Vcc11) is connected to the first light-receiving element PT11 through the resistor R25, to be the ground voltage.

Accordingly, the switching element TR11 is turned off, thereby causing a voltage of a second node N12, at which the external DC voltage (Vcc11) is connected to the switching element TR11 through the resistor R26, to be the DC voltage (Vcc11). While the polarity of the AC voltage is positive, the voltage of the second node N12 is outputted as a phase detecting signal (Vphase).

The first and second phase detectors 14-1, 14-2 are deactivated at a zero voltage, or a voltage close to the zero voltage, due to the voltage sensitivity of the first and second phase detectors 14-1, 14-2. As a result, the phase detecting signal (Vphase) outputted from the second node N12 is outputted as a pulse signal as shown in FIG. 9.

Meanwhile, it is preferable to reduce a power consumption of the phase detecting device 10 by preventing the device from operating when the device does not detect the zero-crossing points, such as when there is no need for the fuser to maintain the predetermined temperature, such as when the image forming apparatus is in a standby mode. However, the phase detecting device 10 of FIG. 8 operates even in the standby mode, thereby causing a large amount of power consumption by the resistors R21, R22, R23, and R24 of the power input unit 12.

Differences in performance of the first and second phase detectors 14-1, 14-2 in detecting the zero-crossing points of the positive and negative polarities the AC voltage occur due to variations in manufacturing and differences in sensitivity of the first and second light-emitting elements D11 and D12 and the first and second light receiving elements PT11, PT12. Thus, a pulse width P1 of the phase detecting signal (Vphase) shown in FIG. 9 which is generated by the second light-emitting element D12 and the second light-receiving element PT12 for a negative polarity of the AC voltage may differ from a pulse width P2 of the phase detecting signal (Vphase) shown in FIG. 9 which is generated by the first light-emitting element D11 and the first light-receiving element D12 for a positive polarity of the AC voltage, which may cause nonuniformities in performing phase control based on the phase detecting signal (Vphase) with respect to the positive and negative polarities of the AC voltage.

SUMMARY OF THE INVENTION

In accordance with an aspect of the invention, there is provided a phase detecting device that accurately detects zero-crossing points of an AC voltage in a normal mode, and reduces electric power consumption in a standby mode.

In accordance with an aspect of the invention, there is provided a phase control device including the phase detecting device referred to above.

In accordance with an aspect of the invention, there is provided a fuser control device for an image forming apparatus, the fuser control device including the phase control device referred to above.

In accordance with an aspect of the invention, a phase detecting device includes a power input unit that receives an AC voltage; a phase detector that detects zero-crossing points of the AC voltage, and outputs a phase detecting signal when the zero-crossing points are detected; and a power switch that selectively cuts off a flow of AC power into the power input unit in response to a mode control signal.

In accordance with an aspect of the invention, the power input unit may include a full-wave rectifier that outputs a rectified AC voltage.

In accordance with an aspect of the invention, the phase detector may detect the zero-crossing points of the AC voltage from the rectified AC voltage outputted from the full-wave rectifier.

In accordance with an aspect of the invention, the mode control signal may include a standby mode control signal that controls the power switch to operate in a standby mode in which a power consumption of the power input unit is reduced by cutting off the flow of the AC power into the power input unit, and the phase detecting signal is not outputted from the phase detector; and a normal mode control signal that controls the power switch to operate in a normal mode in which the AC power flows into the power input unit, and the phase detecting signal is outputted from the phase detector when the zero-crossing points of the AC voltage are detected.

In accordance with an aspect of the invention, the power switch may include a first photocoupler.

In accordance with an aspect of the invention, the power switch may further include a first 3-terminal element; wherein the first terminal element includes a first terminal that receives the mode control signal; a second terminal that receives a predetermined DC voltage and is connected to the first photocoupler; and a third terminal that receives a ground voltage; and wherein the first 3-terminal element provides the first photocoupler with the ground voltage at the second terminal of the first 3-terminal element in response to the standby mode control signal, and provides the first photocoupler with the predetermined DC voltage at the second terminal of the first 3-terminal element in response to the normal mode control signal.

In accordance with an aspect of the invention, the power input unit may include a resistor circuit that divides the AC voltage and outputs a divided AC voltage; and a bridge rectifier that rectifies the divided AC voltage and outputs a rectified AC voltage; wherein the phase detector detects the zero-crossing points of the AC voltage from the rectified AC voltage outputted from the bridge rectifier.

In accordance with an aspect of the invention, the phase detector may include a second photocoupler connected to the bridge rectifier of the power input unit and the first photocoupler of the power switch.

In accordance with an aspect of the invention, the phase detector may further include a second 3-terminal element; wherein the second 3-terminal element includes a first terminal that receives the predetermined DC voltage and is connected to the second photocoupler; a second terminal that receives the predetermined DC voltage; and a third terminal that receives a ground voltage; and wherein the second 3-terminal element outputs the ground voltage from the second terminal of the second 3-terminal element as the phase detecting signal when the zero-crossing points of the AC voltage are detected and the power switch is operating in the normal mode in response to the normal mode control signal; outputs the predetermined DC voltage from the second terminal of the second 3-terminal element when the zero-crossing points of the AC voltage are not detected and the power switch is operating in the normal mode in response to the normal mode control signal; and outputs the ground voltage from the second terminal of the second 3-terminal element when the power switch is operating in the standby mode in response to the standby mode control signal.

In accordance with an aspect of the invention, a phase detecting device includes a power input unit that receives an AC voltage; a phase detector that detects zero-crossing points of the AC voltage, and outputs a phase detecting signal when the zero-crossing points of the AC voltage are detected; and a power switch that selectively cuts off a flow of AC power into the power input unit in accordance with whether the power switch is operating in a normal mode or a standby mode.

In accordance with an aspect of the invention, there is provide a phase control device that controls a phase of an AC power supplied to a device, the phase control device including a phase detecting device the receives an AC voltage, detects zero-crossing points of the AC voltage, outputs a phase detecting signal when the zero-crossing points of the AC voltage are detected, and selectively cuts off a flow of AC power into the phase detecting device in response to a mode control signal; and a signal generator that generates a phase control signal to control the phase of the AC power supplied to the device based on the phase detecting signal.

In accordance with an aspect of the invention, the phase detecting device may include a power input unit that receives the AC voltage; a phase detector that detects the zero-crossing points of the AC voltage, and outputs the phase detecting signal when the zero-crossing points of the AC voltage are detected; and a power switch that selectively cuts off the flow of the AC power into the power input unit in response to the mode control signal.

In accordance with an aspect of the invention, the power input unit may include a full-wave rectifier that outputs a rectified AC voltage.

In accordance with an aspect of the invention, the phase detector may detect the zero-crossing points of the AC voltage from the rectified AC voltage outputted from the full-wave rectifier.

In accordance with an aspect of the invention, the mode control signal may include a standby mode control signal that controls the power switch to operate in a standby mode in which a power consumption of the power input unit is reduced by cutting off the flow of the AC power into the power input unit, and the phase detecting signal is not outputted from the phase detector; and a normal mode control signal that controls the power switch to operate in a normal mode in which the AC power flows into the power input unit, and the phase detecting signal is outputted from the phase detector when the zero-crossing points of the AC voltage are detected.

In accordance with an aspect of the invention, there is provided a fuser control device that controls an AC power supplied to a fuser of an image forming apparatus, the fuser control device including a phase detecting device that receives an AC voltage, detects zero-crossing points of the AC voltage, outputs a phase detecting signal when the zero-crossing points are detected, and selectively cuts off a flow of AC power into the phase detecting device in response to a mode control signal; a signal generator that generates a phase control signal to control a phase of the AC power supplied to fuser based on the phase detecting signal; and a temperature controller that controls a temperature of the fuser by controlling the phase of the AC power supplied to the fuser according to the phase control signal.

In accordance with an aspect of the invention, the mode control signal may include a standby mode control signal that controls the phase detecting device to operate in a standby mode in which a power consumption of the phase detecting device is reduced by cutting off the flow of the AC power into the phase detecting device, and the phase detecting signal is not outputted from the phase detecting device; and a normal mode control signal that controls the phase detecting device to operate in a normal mode in which the AC power flows into the phase detecting device, and the phase detecting signal is outputted from the phase detecting device when the zero-crossing points of the AC voltage are detected.

In accordance with an aspect of the invention, a phase detecting device includes a power input unit including a first terminal and a second terminal; a phase detector including a first terminal and a second terminal, the first terminal of the phase detector being connected to the first terminal of the power input unit; and a power switch including a first terminal and a second terminal, the first terminal of the power switch being connected to the second terminal of the phase detector, and the second terminal of the power switch being connected to the second terminal of the power input unit; wherein the power input unit receives an AC voltage, generates an output voltage from the AC voltage, and outputs the output voltage across the first terminal of the power input unit and the second terminal of the power input unit; wherein the power switch is operable in a normal mode in which the first terminal of the power switch is connected to the second terminal of the power switch, and a standby mode in which the first terminal of the power switch is disconnected from the second terminal of the power switch; wherein when the power switch operates in the normal mode, the output voltage across the first terminal of the power input unit and the second terminal of the power input unit produces a current that flows out of the first terminal of the power input unit, through the phase detector via the first terminal of the phase detector and the second terminal of the phase detector, through the power switch via the first terminal of the power switch and the second terminal of the power switch, and into the second terminal of the power input unit, thereby causing the power input unit to consume power in the normal mode; wherein when the power switch operates in the standby mode, no current flows out of the first terminal of the power input unit, through the phase detector via the first terminal of the phase detector and the second terminal of the phase detector, through the power switch via the first terminal of the power switch and the second terminal of the power switch, and into the second terminal of the power input unit, so that the power input unit does not consume power in the standby mode; wherein when the power switch operates in the normal mode, the phase detector detects zero-crossing points of the AC voltage based on the current flowing through the phase detector, and outputs a phase detecting signal when the zero-crossing points of the AC voltage are detected; and wherein when the power switch operates in the standby mode, the phase detector does not detect the zero-crossing points of the AC voltage, and does not output the phase detecting signal.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other aspects and advantages of the invention will become apparent and more readily appreciated from the following description of embodiments of the invention, taken in conjunction with the accompanying drawings of which.

DETAILED DESCRIPTION OF THE EMBODIMENTS

Figure 1:
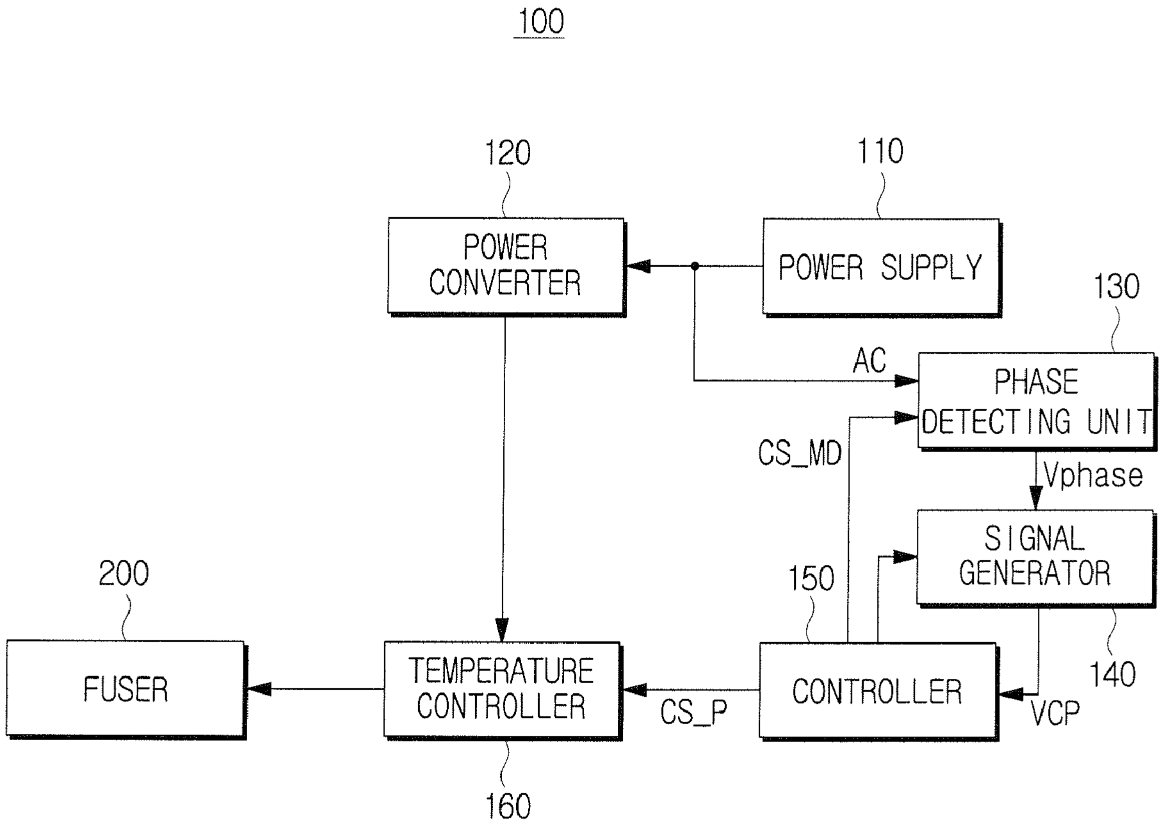
FIG. 1 is a block diagram of a fuser control device according to an aspect of the invention.

Reference will now be made in detail to embodiments of the invention, examples of which are shown in the accompanying drawings, wherein like reference numerals refer to like elements throughout. The embodiments are described below in order to explain the invention by referring to the figures.

Figure 2:
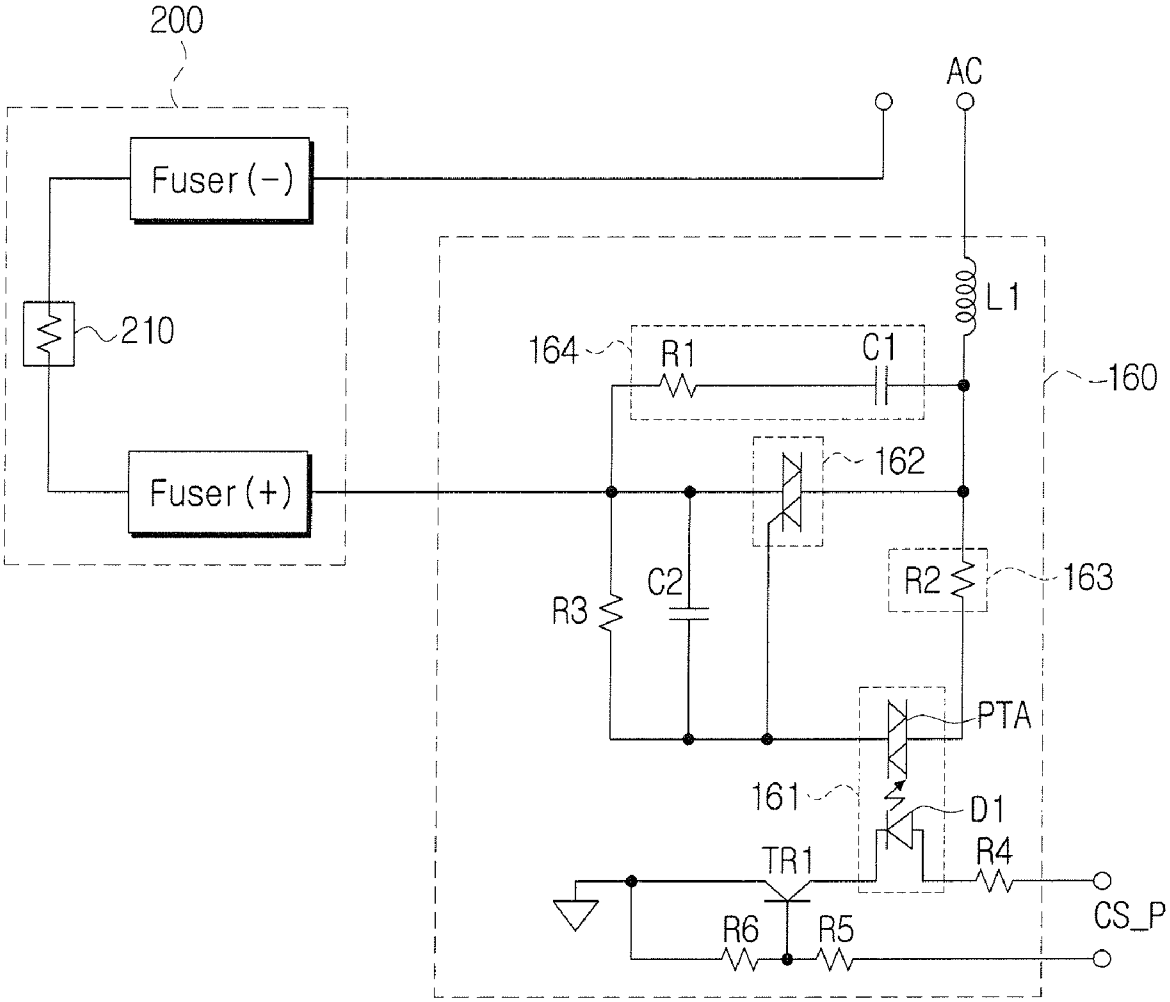
FIG. 2 is a circuit diagram of an example of a temperature controller shown in FIG. 1 according to an aspect of the invention.

FIG. 1 is a block diagram of a fuser control device according to an aspect of the invention, and FIG. 2 is a circuit diagram of an example of a temperature controller shown in FIG. 1 according to an aspect of the invention.

Referring to FIG. 1, a fuser control device 100 according to an aspect of the invention includes a power supply 110, a power converter 120, a phase detecting device 130, a signal generator 140, a controller 150, and a temperature controller 160.

The power supply 110 includes a Switching Mode Power Supply (SMPS), and outputs An AC voltage to the power converter 120 and the phase detecting device 130.

The power converter 120 converts a level of the AC voltage outputted from the power supply 110 and outputs a converted AC voltage to the temperature controller 160.

The phase detecting device 130 detects zero-crossing points of the AC voltage outputted from the power supply 110, and outputs a phase detecting signal (Vphase) when the zero-crossing points are detected. The phase detecting device 130 may receive the AC voltage from the power supply 110 as shown in FIG. 1, or may receive the converted AC voltage from the power converter 120.

The signal generator 140 generates and outputs a phase control signal (VCP) under the control of the controller 150 based on the phase detecting signal (Vphase) outputted from the phase detecting device 130. The signal generator 140 generates the phase control signal (VCP), which controls a phase of AC power supplied to a fuser 200, based on starting and ending points of pulses of the phase detecting signal (Vphase) and an output time of the phase detecting signal (Vphase).

The operation of the phase detecting device 130 and the signal generator 140 will be described below.

The controller 150 outputs control signals which control an overall operation of each unit of the fuser control device 100. The controller 150 receives the phase control signal (VCP) outputted from the signal generator 140, controls the signal generator to adjust the timing of the phase control signal (VCP) according to a temperature of the fuser 200, and outputs the received phase control signal (VCP) to the temperature controller 160 as a phase control signal (CS_P). The controller 150 and the signal generator 140 may be provided in one chip, or may be provided separately as shown in FIG. 1.

The temperature controller 160 receives the converted AC voltage from the power converter 120, and controls the temperature of the fuser 200 by controlling a phase of AC power supplied to the fuser 200 according to the phase control signal (CS_P), in which the output timing is controlled by the signal generator 140 according to a control signal or temperature information received from the controller 150.

Referring to FIG. 2, the temperature controller 160 may include a first switching circuit 161 that receives the converted AC voltage from the power controller 120 shown in FIG. 1 through an inductor L1 and is activated by the phase control signal (CS_P) received from the controller 150 shown in FIG. 1 through a resistor R4; a second switching circuit 162 activated in accordance with an activation state of the first switching circuit 161; a current limiter 163 including a resistor R2 limiting electric current flowing into the first switching circuit 161; a noise suppression unit 164 including a resistor R1 and a capacitor C1 which suppresses noise generated when the second switching circuit 162 is activated; and a resistor R3 and a capacitor C2 connected between the first switching circuit 161 and the second switching circuit 162.

The first switching circuit 161 may include a light-emitting element D1 such as a light-emitting diode, and a light-receiving element such as a phototriac (PTA) optically coupled to, and activated by light emitted from, the light-emitting element D1. The light-emitting element D1 emits light as a transistor TR1 biased by resistors R5, R6 is turned on by the phase control signal (CS_P) received from the controller 150 through the resistor R4. The light enters and activates the light-receiving element PTA forming a current path. One terminal of the light-emitting element D1 is connected to one terminal of the transistor TR1, and the light-receiving element PTA is optically coupled to the light-emitting element D1.

The second switching circuit 162 may include a switching element such as a triac (TA) activated by an input signal received from the light-receiving element PTA of the first switching circuit 161. The second switching circuit 162 is activated in accordance with an activation state of the light-receiving element PTA of the first switching circuit 161. That is, AC power inputted from the power converter 120 flows through the second switching circuit 162 into the fuser 200 as the light-receiving element PTA is turned on.

The AC power inputted from the power converter 120 flowing into the fuser 200 through the second switching circuit 162 has its phase controlled by the transistor TR1 which is selectively activated according to the phase control signal (CS_P) and by the first and second switching circuits 161, 162.

The current limiter 163 is provided in order to reduce the amount of the AC flowing from the fuser 200 and the second switching circuit 162 into the first switching circuit 161 when the second switching circuit 162 is activated.

The noise suppression unit 164 is provided in order to suppress noise generated when the second switching circuit 162 is activated. For example, the noise suppression unit 164 suppresses a noise such as a spark generated when an internal voltage of the triac (TA) of the second switching circuit 162 is suddenly changed from 0 V to a turn-on voltage.

The fuser 200 may include a heating roller and a pressure roller (not shown in the drawings).

The heating roller fixes a toner image on a print medium by applying heat. A heating element 210 is disposed inside the heating roller in order to convert the AC power inputted from the power supply 120, that is, electric energy, into heat energy.

The heating element 210 may, for example, be a DC driving type heating lamp.

The pressure roller is rotatably disposed in contact with the heating roller, and fixes the toner image onto the print medium by applying pressure.

The temperature controller 160 maintains a temperature of a surface of the heating roller inside the fuser 200 at a constant target temperature by controlling the temperature of the heating element 210.

In this procedure, AC power flows into the heating element 210 with its phase controlled so that the heating element 210 is heated to the target temperature and maintains the target temperature. Heat generated by the heating element 210 passes through an organic photoconductive (OPC) drum (not shown in the drawings) of the image forming apparatus (not shown in the drawings), and fixes the toner image onto the print medium.

Figure 3:
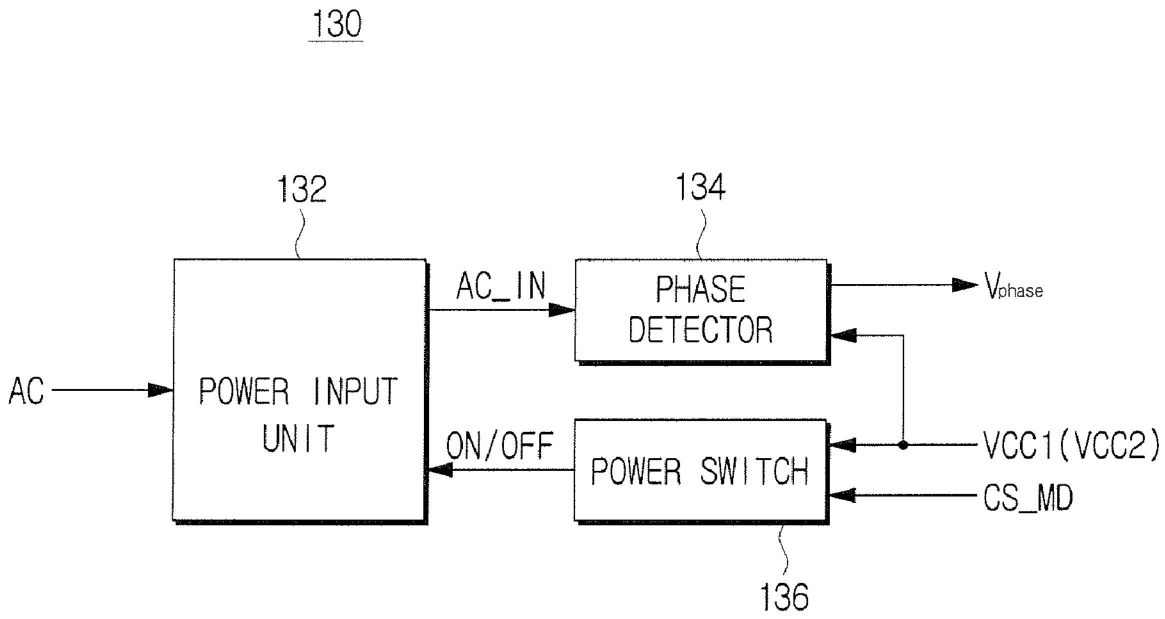
FIG. 3 is a block diagram of a phase detecting device shown in FIG. 1 according to an aspect of the invention.
Figure 4:
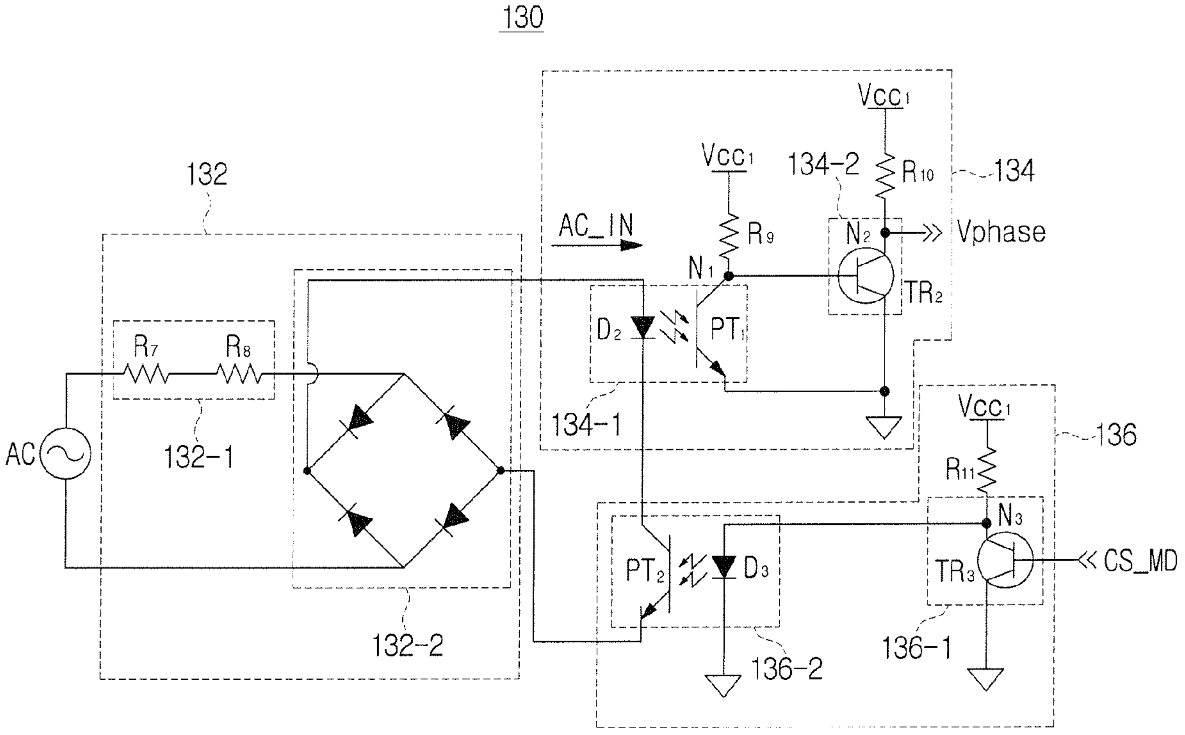
FIG. 4 is a circuit diagram of an example of the phase detecting device shown in FIG. 3 according to an aspect of the invention.
Figure 5:
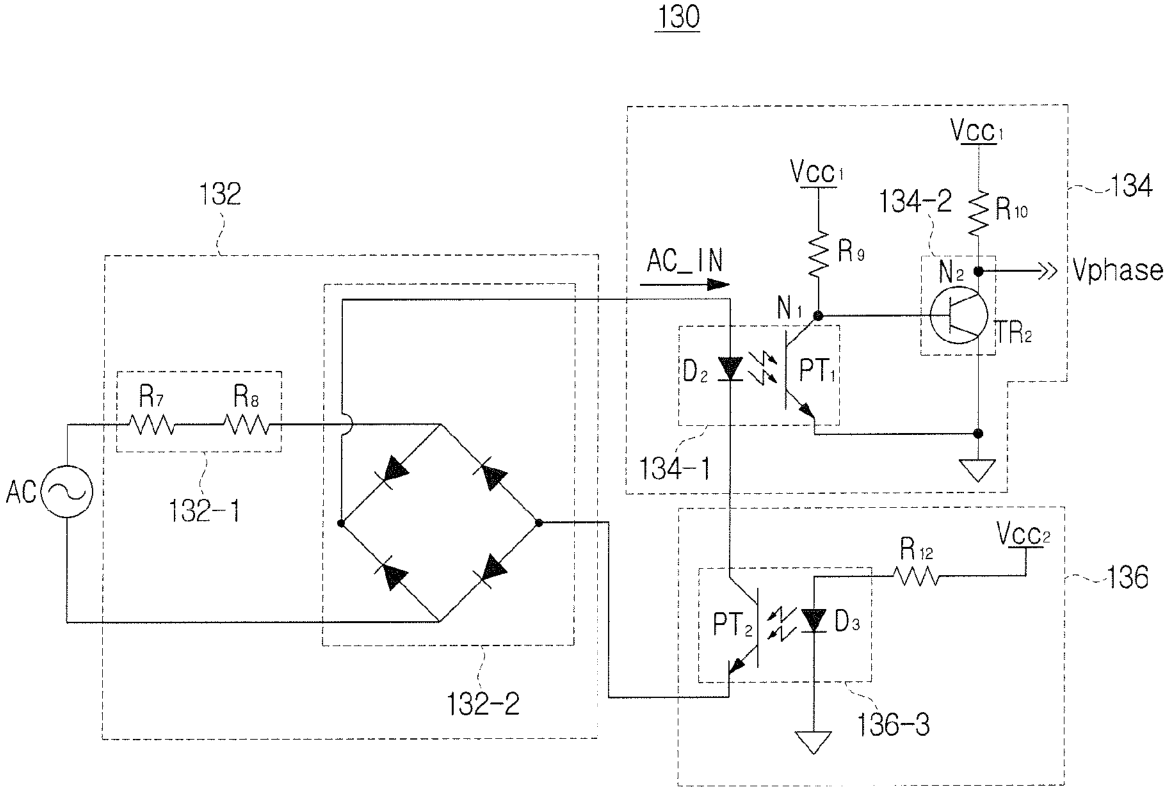
FIG. 5 is a circuit diagram of another example of the phase detecting device shown in FIG. 3 according to an aspect of the invention.

FIG. 3 is a block diagram of a phase detecting device shown in FIG. 1 according to an aspect of the invention, FIG. 4 is a circuit diagram of an example of the phase detecting device shown in FIG. 3 according to an aspect of the invention, and FIG. 5 is a circuit diagram of another example of the phase detecting device shown in FIG. 3 according to an aspect of the invention.

Referring to FIG. 3, a phase detecting device 130 according to an aspect of the invention may include a power input unit 132, a phase detector 134, and a power switch 136.

The AC voltage received from the power supply 110 or the power converter 120 shown in FIG. 1 is divided by the power input unit 132 to have a predetermined voltage level, and the power input unit 132 outputs the divided AC voltage (AC_IN).

Referring to FIGS. 4 and 5, the power input unit 132 may include a resistor circuit 132-1 including resistors R7, R8 connected in series that divide the AC voltage, and a full-wave rectifier 132-2 rectifying the divided AC voltage.

The resistor circuit 132-1 may preferably be disposed at the front end of the full-wave rectifier 132-2 in order to improve stability of a reverse-bias stress thereof.

The full-wave rectifier 132-2 may, for example, include a bridge rectifier, and perform full-wave rectification of the divided AC voltage and output the resultant rectified AC voltage (AC_IN).

The phase detector 134 is activated by receiving the rectified AC voltage outputted from the power input unit 132, and outputs the phase detecting signal (Vphase).

Referring to FIGS. 4 and 5, the phase detector 134 may include a third switching circuit 134-1 and a fourth switching circuit 134-2 to generate and output the phase detecting signal (Vphase).

The third switching circuit 134-1 may, for example, include a photocoupler including a light-emitting element D2 connected to the full-wave rectifier 132-2, and a light-receiving element PT1 activated by light emitted from the light-emitting element D2 optically coupled thereto. The light-receiving element PT1 is connected to an external direct current (DC) voltage (Vcc1) at a first node N1 through a resistor R9, and to a ground voltage (indicated by an inverted triangle in FIG. 4).

The fourth switching circuit 134-2 may, for example, include a transistor TR2 including a first terminal connected to the first node N1; a second terminal connected to the voltage Vcc1 at a second node N2 through a resistor R10; and a third terminal connected to the ground voltage. The fourth switching circuit 134-2 is activated in accordance with the activation state of the third switching circuit 134-1, and selectively outputs the voltage Vcc1 or the ground voltage as the phase detecting signal (Vphase).

For example, the voltage at the first node N1 is the voltage Vcc1 when the third switching circuit 134-1 is inactivated, so that the transistor TR2 is turned on by the voltage Vcc1 at the first node N1, thereby connecting the second node N2 to the ground voltage when the transistor TR2 is an npn-type transistor as shown in FIGS. 4 and 5. Hence, the voltage at the second node N2 becomes the ground voltage, and the phase detecting signal (Vphase) is outputted as the ground voltage.

When the third switching circuit 134-1 is activated, the voltage at the first node N1 is the ground voltage, the transistor TR2 is turned off by ground voltage at the first node N1, the voltage at the second node N2 is the voltage Vcc1, and the phase detecting signal (Vphase) is outputted as the voltage Vcc1.

However, the phase detecting signal (Vphase) is outputted as the ground voltage when the third switching circuit 134-2 is activated, and is outputted as the voltage Vcc1 when the third switching circuit 134-1 is inactivated, when the transistor TR2 is a pnp-type transistor.

Figure 9:
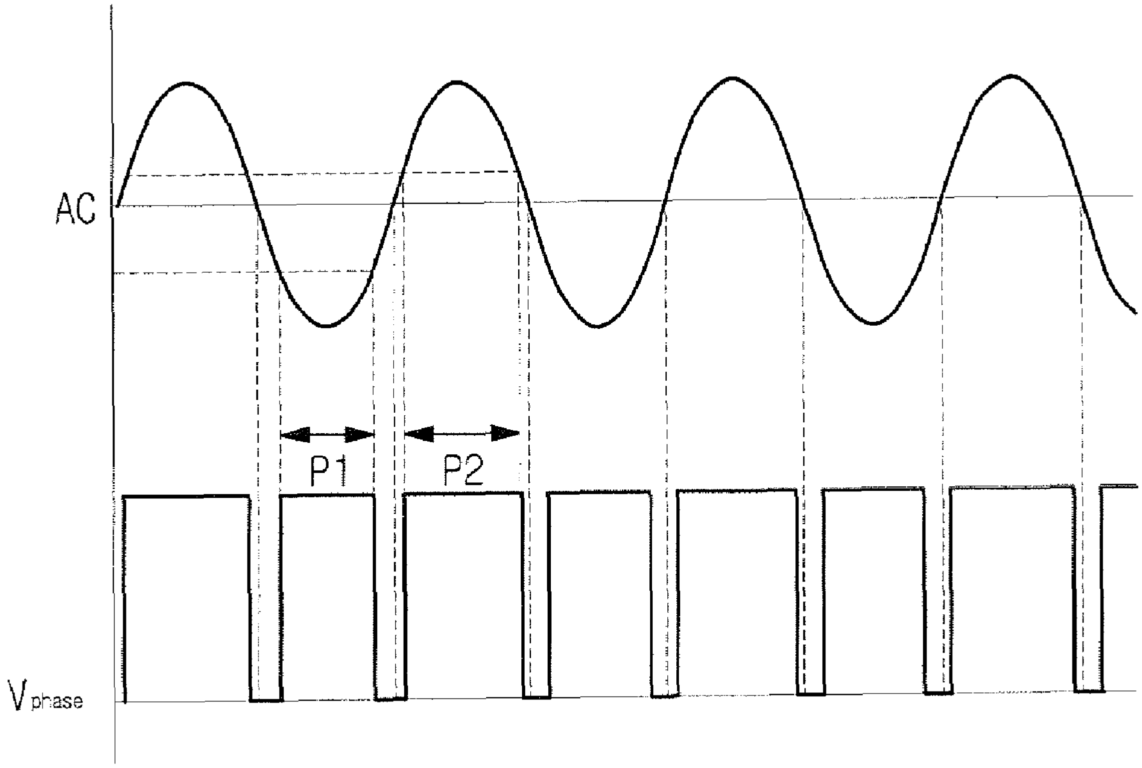
FIG. 9 (RELATED ART)
FIG. 9 is a drawing explaining the operation of the phase detecting device shown in FIG. 8 according to the related art.

According to an aspect of the invention, the phase detecting device 130 only requires one phase detector 134 by performing the full-wave rectification of the AC voltage with the bridge rectifier, while the phase detecting device 10 in FIG. 9 according to the related art requires two phase detectors 14-1, 14-2.

Referring again to FIG. 3, the power switch 136 may selectively prevent AC power from flowing into the power input unit 132 in response to a mode control signal (CS_MD) received from outside the phase detecting device 130.

The mode control signal may be received from the controller 150 shown in FIG. 1 as indicated by the dashed line in FIG. 1. The mode control signal may include a standby mode control signal which opens a circuit including the power input unit 132 and the phase detector 134 by inactivating the power switch 136 to operate in a standby mode, which prevents AC power from flowing into the power input unit 132 and thus reduces power consumption in the power input unit 132, especially in the resistor circuit 132-1.

The mode control signal may further include a normal mode signal which makes activates the power input unit 132 to close the circuit including the power unit 132 and the phase detector 134, so that the power switch 136 operates in a normal mode in which AC power flows into the power input unit 132 and the AC voltage is converted the converted AC voltage (AC_IN), and the phase detecting signal (Vphase) is generated from the converted AC voltage (AC_IN).

FIG. 4 shows the power switch 136 receiving the standby mode control signal and the normal mode control signal directly from the controller 150, and FIG. 5 shows the power switch 136 receiving a voltage at a different level in the normal mode and standby mode respectively.

Referring to FIG. 4, the power switch 136 of the phase detecting device 130 according to an aspect of the invention may include a fifth switching circuit 136-1 and a sixth switching circuit 136-2.

The fifth switching circuit 136-1 may, for example, include a transistor TR3 including a first terminal connected to the controller 150 and receiving the mode control signal (CS_MD); a second terminal connected to the DC voltage (Vcc1) at a node N3 through a resistor R11; and a third terminal connected to the ground voltage.

For example, the transistor TR3 is turned on when it is an npn-type transistor and receives the standby mode control signal which is set to a high-level voltage in the controller 150. The voltage at the third node N3 is the ground voltage, since the node N3 is connected to the ground voltage when the transistor TR3 is turned on.

The transistor TR3 is turned off when it receives the normal mode signal which is set to a low-level voltage in the controller 150. Accordingly, the voltage at the third node N3 is the DC voltage (Vcc1).

The sixth switching circuit 136-2 may, for example, include a photocoupler including a light-emitting element D3 connected to the third node N3 which is activated according to the voltage at the third node N3, and a light-receiving element PT2 optically coupled to the light-emitting element D3 which is activated by light emitted from the light-emitting element D3. The light-receiving element PT2 is connected to the phase detector 134 and the power input unit 312.

The voltage at the third node N3 is the DC voltage (Vcc1) when the fifth switching circuit 136-1 receives the normal mode control signal. Hence, the sixth switching circuit 136-2 is activated and the power input unit 132 is closes the circuit including the power input unit 132 and the phase detector 134, and the phase detector 134 detects the zero-crossing points of the converted AC voltage (AC_IN), and outputs the voltage at the second node N2 when the zero-crossing points are detected.

The voltage at the third node N3 is the ground voltage when the fifth switching circuit 136-1 receives the standby mode control signal. Hence, the sixth switching circuit 136-2 is inactivated and the power input unit 132 opens the circuit including the power input unit 132 and the phase detector 134, so that the power consumption in the power input unit 132 can be reduced.

According to an aspect of the invention, the standby mode control signal is set to a high-level voltage and the normal mode control signal is set to a low-level voltage. However, each mode control signal may have a different voltage level according to the circuit design, and the design of each switching circuit may include various other circuit elements such as a relay switch.

Referring to FIG. 5, the power switch 136 of the phase detecting device 130 according to an aspect of the invention may include a seventh switching circuit 136-3 connected to the DC voltage (Vcc2) that is different from the dc voltage (Vcc1) received by the phase detector 134.

The seventh switching circuit 136-3 may have substantially the same configuration as the sixth switching circuit 136-2 shown in FIG. 4, so a detailed description of the seventh switching circuit 136-3 will be omitted for the sake of brevity. The seventh switching element 136-3 is connected to the DC voltage (Vcc2) through a resistor R12, and is connected to the phase detector 134 and the power input unit 132.

Under the control of the controller 150, the power supply 110 or the power converter 120 may turn off the DC voltage (Vcc2) supplied to the power switch 136 of the phase detecting device 130 in a standby mode, and may turn on the DC voltage (Vcc2) in a normal mode.

It is desirable that the power supply 110 or the power converter 120 provides the DC voltage (Vcc2) at a different level from the DC voltage (Vcc1).

The DC voltage (Vcc2) may be selectively turned off by the controller 150 in the standby mode during which the fuser 200 is not driven and turned on by the controller in the normal mode in which the fuser 200 is driven, and may used as a DC power source for the seventh switching circuit 136-3 shown in FIG. 5 so that the seventh switching circuit 136-3 shown in FIG. 5 can be operated in the same manner as the sixth switching circuit 136-2 shown in FIG. 4.

A fuser control device according to an aspect of the invention will now be described in detail.

Figure 6:
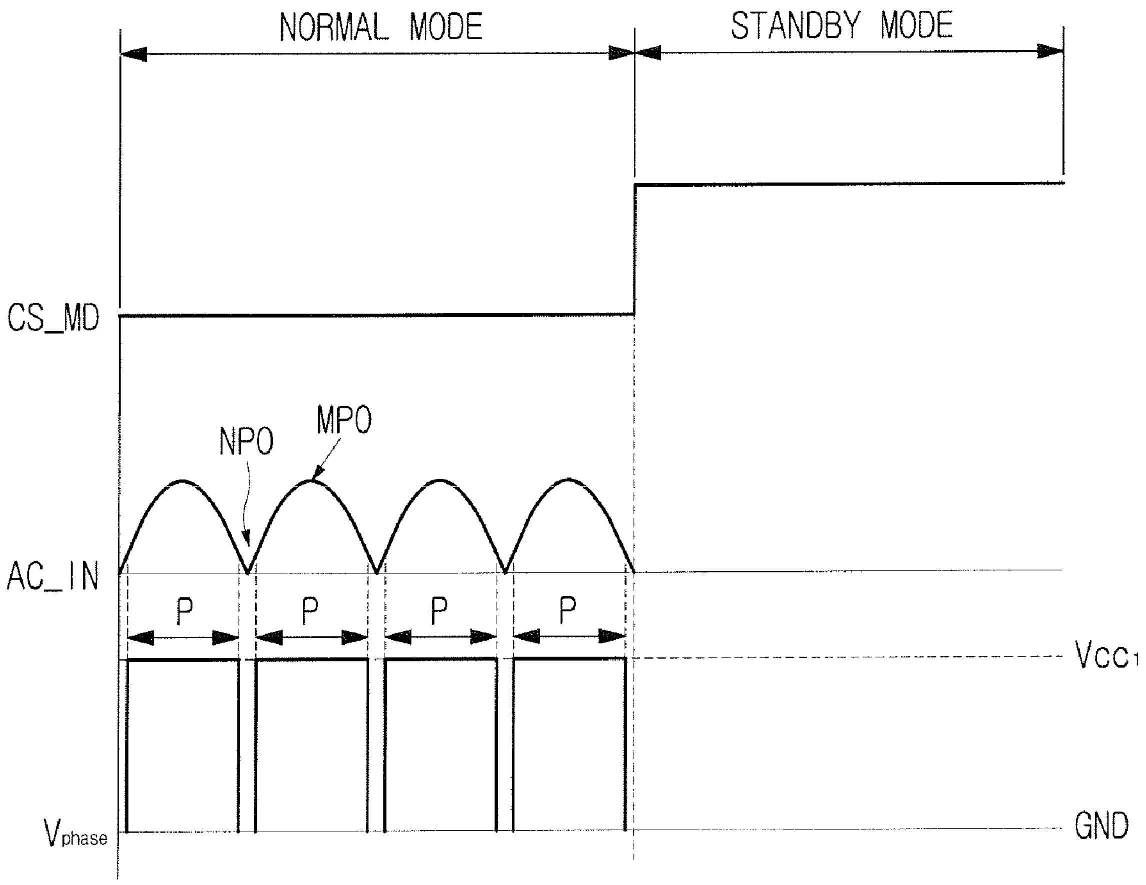
FIG. 6 is a diagram for explaining the operation of the phase detecting device shown in FIG. 4 according to an aspect of the invention.

FIG. 6 is a diagram for explaining the operation of the phase detecting device shown in FIG. 4 according to an aspect of the invention.

Referring to FIGS. 4 and 6, the phase detecting device according to an aspect of the invention receives the normal mode control signal having a low voltage level as the mode control signal (CS_MD) in the normal mode. Accordingly, the power switch 136 is activated by the normal mode control signal.

The AC voltage is rectified and converted to the rectified AC voltage (AC_IN), and the phase detector 134 detects the zero-crossing points of the rectified AC voltage (AC_IN) in accordance with the ON/OFF switching of the third and fourth switching circuits 134-1, 134-2. That is, the phase detector 134 detects the zero-crossing points through repeated ON/OFF switching of the third switching circuit 134-1 according to the voltage variation of the rectified AC (AC_IN). The fourth switching circuit 134-1 is inactivated or activated while the third switching circuit 134-1 is activated or inactivated respectively, and outputs the high or low voltage at the second node N2 as the phase detecting signal (Vphase).

A zero-crossing point as detected by the phase detector 134 is the lowest voltage level NP0 that can be sensed in consideration of variations in the sensitivity of the elements of the phase detector 134 and manufacturing variations. However, according to an aspect of the invention, the zero-crossing point can be detected at the same point in each half-cycle of the AC voltage by using only one phase detector 134.

The third switching circuit 134-1 is activated while the voltage level of the rectified AC voltage (AC_IN) varies between the lowest voltage level NP0 and the highest voltage level MP0, so that the voltage at the second node N2 is the voltage DC (Vcc1) and is output as the phase detecting signal (Vphase). The light-emitting element D2 is turned off when the voltage level of the rectified AC voltage (AC_IN) is lower than the lowest voltage level NP0, so that the voltage at the second node N2 is the ground voltage and is output as the phase detecting signal (Vphase). Hence, the phase detecting signal (Vphase) is outputted as a pulse signal in which each pulse has a predetermined pulse width (P).

As a result, the phase detecting signal (Vphase) may be provided regularly because there are no sensitivity differences between a plurality of phase detectors detecting the zero-crossing points, such as the first and second phase detectors 14-1, 14-2 shown in FIG. 2 according to the related art, or manufacturing variations of such a plurality of phase detectors. Thus, the accuracy of phase control can be improved according to an aspect of the invention.

When the standby mode control signal having a high voltage level is received as the mode control signal (CS_MD), the transistor TR3 of the power switch 136 is turned on by the standby mode control signal, thereby placing the phase detecting device 130 in the standby mode, and the power switch 136 is inactivated. AC power flowing into the power input unit 132 is cut off, the output of the rectified AC voltage (AC_IN) from the power unit 132 is also cut off, and the node N3 is connected to the ground voltage since the transistor TR3 is turned on, so that the voltage at the second node N2 is the ground voltage. Therefore, the flow of the AC power into the power input unit 132 is cut off, and the phase detecting signal (Vphase) is outputted as the ground voltage.

Although the phase detecting device shown in FIG. 4 has been described as an example, the phase detecting device shown in FIG. 5 may also be operated in the same manner as the phase detecting device shown in FIG. 4.

Figure 7:
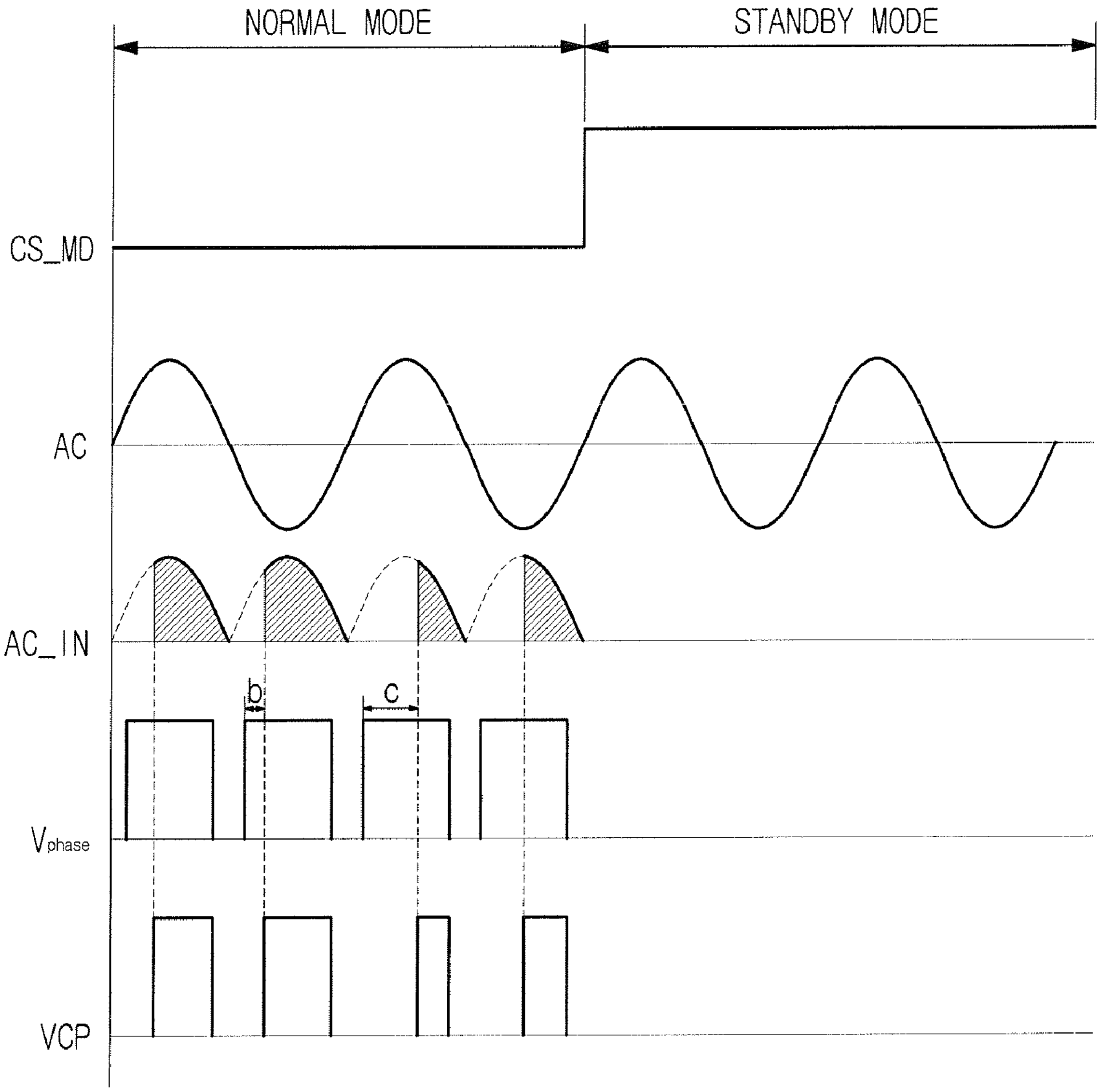
FIG. 7 is a diagram for explaining the operation of the fuser control device shown in FIG. 1 according to an aspect of the invention.
Figure 8:
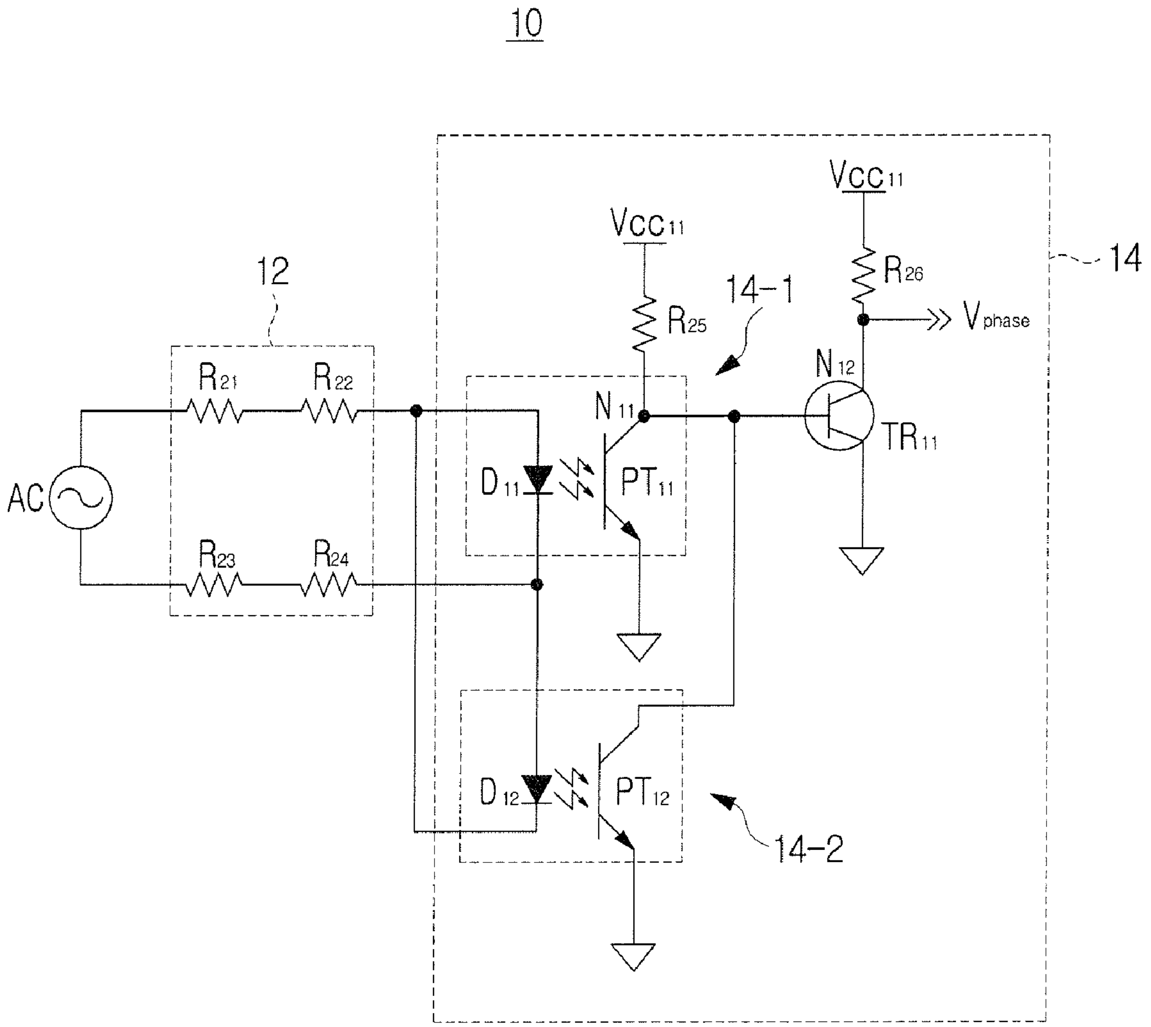
FIG. 8 (RELATED ART)
FIG. 8 is a circuit diagram of an example of a phase detecting device according to the related art.

FIG. 7 is a diagram for explaining the operation of the fuser control device shown in FIG. 1 according to an aspect of the invention.

Referring to FIGS. 1, 4, and 7, in the fuser control device 100 operating in a normal mode according to an aspect of the invention, the rectified AC voltage (AC_IN) is outputted from the power input unit 132 when the power switch 136 receives the normal mode signal having a low voltage level as shown in FIG. 6. The phase detector 134 outputs the phase detecting signal (Vphase) having pulses each having the same pulse width based on the rectified AC voltage (AC_IN).

The phase detecting signal (Vphase) outputted from the phase detector 134 is inputted to the signal generator 140, and the controller 150 determines the temperature of the fuser 200 and controls the signal generator 140 to generate the phase control signal (CS_P) according to the temperature, and provides the temperature controller 160 with the phase control signal (VCP) of which the output timing is controlled.

The temperature controller 160 performs ON/OFF switching of the first and second switching circuits 161, 162 according to the phase control signal (CS_P) so that the fuser 200 is heated to a target temperature, and maintains the target temperature.

The controller 150 controls the signal generator 140 so that the phase control signal (VCP) is outputted after a relatively short delay (b) from the beginning of a pulse of the phase detecting signal (Vphase) when the temperature of the fuser 200 is lower than the target temperature. Accordingly, a relatively large amount of AC power flows into the fuser 200, thereby increasing the temperature of the fuser 200. The controller 150 controls the signal generator 140 so that the phase control signal (VCP) is outputted after a relatively long delay (c) from the beginning of a pulse of the phase detecting signal (Vphase) when the temperature of the fuser 200 is higher than the target temperature. As a result, a relatively small amount of AC power flows into the fuser 200, thereby lowering the temperature of the fuser 200.

Because the pulses of the phase detecting signal (Vphase) have a constant pulse width and the start and end points of the pulses occur at the same level of the AC voltage, the phase control signal (VCP), which is generated based on the phase detecting signal (Vphase), may be outputted at constant delays according to a certain AC voltage. Thus, the accuracy of phase control can be improved according to an aspect of the invention.

As shown in FIG. 6, when the fuser control device 100 according to an aspect of the invention is in the standby mode, the standby mode control signal having a high voltage level is supplied to the power switch 136, and although the AC voltage is constantly supplied to the power input unit 132, the flow of AC power into the power unit 132 and the output of the rectified AC voltage (AC_IN) from the power input unit 132 are cut off. Additionally, the output of the phase detecting signal (Vphase) and the phase control signal (VCP) are cut off.

In the standby mode, the temperature controller 160 is inactivated, and the flow of AC power into the fuser 200 is cut off so that the fuser 200 operates in a standby mode in which the fuser 200 does not produce heat. The phase detecting device 130 is also operates in the standby mode in order to reduce power consumption in the power input unit 132.

As is apparent from the foregoing description, according to an aspect of the invention, the power consumption of a circuit element in the phase detecting device that detects the zero-crossing points of the AC voltage can be reduced by selectively operating the phase detecting device 130 in a standby mode.

In addition, it is possible to use only one phase detector in a phase detecting device according to an aspect of the invention to detect zero-crossing points of an AC voltage by using a full-wave rectifier to rectify the AC voltage before detecting the zero-crossing points. Thus, a manufacturing cost and a size of a phase detecting device according to an aspect of the invention can be reduced and reliability in fabrication of the phase detecting device can be improved. Also, the use of only one phase detector in the phase detecting device according to an aspect of the invention makes it possible to detect the zero-crossing points of the AC voltage more accurately than in a phase detecting device according to the related art.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A phase detecting device comprising:

a power input unit that receives an AC voltage;

a phase detector that detects zero-crossing points of the AC voltage, and outputs a phase detecting signal when the zero-crossing points of the AC voltage are detected; and a power switch that selectively cuts off a flow of AC power into the power input unit in response to a mode control signal;

wherein the phase detector does not detect the zero-crossing points of the AC voltage when the power switch cuts off the flow of the AC power into the power input unit in response to the mode control signal.

2. The phase detecting device of claim 1, wherein the power input unit comprises a full-wave rectifier that outputs a rectified AC voltage.

3. The phase detecting device of claim 2, wherein the phase detector detects the zero-crossing points of the AC voltage from the rectified AC voltage outputted from the full-wave rectifier.

4. A phase detecting device comprising:

a power input unit that receives an AC voltage;

a phase detector that detects zero-crossing points of the AC voltage, and outputs a phase detecting signal when the zero-crossing points of the AC voltage are detected; and a power switch that selectively cuts off a flow of AC power into the power input unit in response to a mode control signal;

wherein the mode control signal comprises:

a standby mode control signal that controls the power switch to operate in a standby mode in which a power consumption of the power input unit is reduced by cutting off the flow of the AC power into the power input unit, and the phase detecting signal is not outputted from the phase detector; and a normal mode control signal that controls the power switch to operate in a normal mode in which the AC power flows into the power input unit, and the phase detecting signal is outputted from the phase detector when the zero-crossing points of the AC voltage are detected.

5. The phase detecting device of claim 4, wherein the power switch comprises a first photocoupler.

6. The phase detecting device of claim 5, wherein the power switch further comprises a first 3-terminal element wherein the first 3-terminal element comprises:

a first terminal that receives the mode control signal, a second terminal that receives a predetermined DC voltage and is connected to the first photocoupler, and a third terminal that receives a ground voltage; and wherein the first 3-terminal element provides the first photocoupler with the ground voltage at the second terminal of the first 3-terminal element in response to the standby mode control signal, and provides the first photocoupler with the predetermined DC voltage at the second terminal of the first 3-terminal element in response to the normal mode control signal.

7. The phase detecting device of claim 6, wherein the power input unit comprises:

a resistor circuit that divides the AC voltage and outputs a divided AC voltage; and a bridge rectifier that rectifies the divided AC voltage and outputs a rectified AC voltage; and wherein the phase detector detects the zero-crossing points of the AC voltage from the rectified AC voltage outputted from the bridge rectifier.

8. The phase detecting device of claim 7, wherein the phase detector comprises a second photocoupler connected to the bridge rectifier of the power input unit and the first photocoupler of the power switch.

9. The phase detecting device of claim 8, wherein the phase detector further comprises a second 3-terminal element;

wherein the second 3-terminal element comprises:

a first terminal that receives the predetermined DC voltage and is connected to the second photocoupler, a second terminal that receives the predetermined DC voltage; and a third terminal that receives a ground voltage, and wherein the second 3-terminal element outputs the ground voltage from the second terminal of the second 3-terminal element as the phase detecting signal when the zero-crossing points of the AC voltage are detected and the power switch is operating in the normal mode in response to the normal mode control signal, outputs the predetermined DC voltage from the second terminal of the second 3-terminal element when the zero-crossing points of the AC voltage are not detected and the power switch is operating in the normal mode in response to the normal mode control signal, and outputs the ground voltage from the second terminal of the second 3-terminal element when the power switch is operating in the standby mode in response to the standby mode control signal.

10. A phase detecting device comprising:

a power input unit that receives an AC voltage;

a phase detector that detects zero-crossing points of the AC voltage, and outputs a phase detecting signal when the zero-crossing points of the AC voltage are detected; and a power switch that selectively cuts off a flow of AC power into the power input unit in accordance with whether the power switch is operating in a normal mode or a standby mode;

wherein the power switch cuts off the flow of the AC power into the power input unit when the power switch is operating in the standby mode; and wherein the phase detector does not detect the zero-crossing points of the AC voltage when the power switch cuts off the flow of the AC power into the power input unit when the power switch is operating in the standby mode.

11. A phase detecting device comprising:

a power input unit that receives an AC voltage;

a phase detector that detects zero-crossing points of the AC voltage, and outputs a phase detecting signal when the zero-crossing points of the AC voltage are detected; and a power switch that selectively cuts off a flow of AC power into the power input unit in accordance with whether the power switch is operating in a normal mode or a standby mode;

wherein the standby mode is a mode in which the power switch cuts off the flow of the AC power into to the power input unit to reduce a power consumption of the power input unit, and the phase detecting signal is not outputted from the phase detector; and wherein the normal mode is a mode in which the power switch allows the AC power to flow into the power input unit, and the phase detecting signal is outputted from the phase detector when the zero-crossing points of the AC voltage are detected.

12. The phase detecting device of claim 11, wherein the power switch comprises a first photocoupler.

13. The phase detecting device of claim 12, wherein the power switch receives a first predetermined DC voltage when the power switch is operating in the normal mode and supplies the first predetermined DC voltage to the first photocoupler when the power switch is operating in the normal mode; and wherein the power switch does not receive the first predetermined DC voltage when the power switch is operating in the standby mode and does not supply any voltage to the first photocoupler when the power switch is operating in the standby mode.

14. The phase detecting device of claim 13, wherein the power input unit comprises:

a resistor circuit that divides the AC voltage and outputs a divided AC voltage; and a bridge rectifier that rectifies the divided AC voltage and outputs a rectified AC voltage; and wherein the phase detector detects the zero-crossing points of the AC voltage from the rectified AC voltage outputted from the bridge rectifier.

15. The phase detecting device of claim 14, wherein the phase detector comprises a second photocoupler connected to the bridge rectifier of the power input unit and the first photocoupler of the power switch.

16. The phase detecting device of claim 15, wherein the phase detector further comprises a 3-terminal element;

wherein the 3-terminal element comprises:

a first terminal that receives a second predetermined DC voltage and is connected to the second photocoupler, a second terminal that receives the second predetermined DC voltage, and a third terminal that receives a ground voltage; and wherein the second 3-terminal element outputs the ground voltage from the second terminal of the 3-terminal element as the phase detecting signal when the zero-crossing points of the AC voltage are detected and the power switch is operating in the normal mode, outputs the second predetermined DC voltage from the second terminal of the 3-terminal element when the zero-crossing points of the AC voltage are not detected and the power switch is operating in the normal model, and outputs the ground voltage from the second terminal of the second 3-terminal element when the power switch is operating in the standby mode.

17. The phase detecting device of claim 16, wherein the second predetermined DC voltage is different from the first predetermined DC voltage.

18. A phase control device that controls a phase of an AC power supplied to a controlled device, the phase control device comprising:

a phase detecting device that receives an AC voltage, detects zero-crossing points of the AC voltage, outputs a phase detecting signal when the zero-crossing points of the AC voltage are detected, and selectively cuts off a flow of AC power into the phase detecting device in response to a mode control signal; and a signal generator that generates a phase control signal to control the phase of the AC power supplied to the controlled device based on the phase detecting signal;

wherein the phase detecting device does not detect the zero-crossing points of the AC voltage when the phase detecting device cuts off the flow of the AC power into the phase detecting device in response to the mode control signal.

19. The phase control device of claim 18, wherein the phase detecting device comprises:

a power input unit that receives the AC voltage;

a phase detector that detects the zero-crossing points of the AC voltage, and outputs the phase detecting signal when the zero-crossing points of the AC voltage are detected; and a power switch that selectively cuts off the flow of the AC power into the power input unit in response to the mode control signal.

20. The phase control device of claim 19, wherein the power input unit comprises a full-wave rectifier that outputs a rectified AC voltage.

21. The phase control device of claim of claim 20, wherein the phase detector detects the zero-crossing points of the AC voltage from the rectified AC voltage outputted from the full-wave rectifier.

22. A phase control device that controls a phase of an AC power supplied to a controlled device, the phase control device comprising:

a phase detecting device that receives an AC voltage, detects zero-crossing points of the AC voltage, outputs a phase detecting signal when the zero-crossing points of the AC voltage are detected, and selectively cuts off a flow of AC power into the phase detecting device in response to a mode control signal; and a signal generator that generates a phase control signal to control the phase of the AC power supplied to the controlled device based on the phase detecting signal;

wherein the phase detecting device comprises:

a power input unit that receives the AC voltage;

a phase detector that detects the zero-crossing points of the AC voltage, and outputs the phase detecting signal when the zero-crossing points of the AC voltage are detected; and a power switch that selectively cuts off the flow of the AC power into the power input unit in response to the mode control signal; and wherein the mode control signal comprises:

a standby mode control signal that controls the power switch to operate in a standby mode in which a power consumption of the power input unit is reduced by cutting off the flow of the AC power into the power input unit, and the phase detecting signal is not outputted from the phase detector; and a normal mode control signal that controls the power switch to operate in a normal mode in which the AC power flows into the power input unit, and the phase detecting signal is outputted from the phase detector when the zero-crossing points of the AC voltage are detected.

23. A phase detecting device comprising:

a power input unit comprising a first terminal and a second terminal;

a phase detector comprising a first terminal and a second terminal, the first terminal of the phase detector being connected to the first terminal of the power input unit; and a power switch comprising a first terminal and a second terminal, the first terminal of the power switch being connected to the second terminal of the phase detector, and the second terminal of the power switch being connected to the second terminal of the power input unit;

wherein the power input unit receives an AC voltage, generates an output voltage from the AC voltage, and outputs the output voltage across the first terminal of the power input unit and the second terminal of the power input unit;

wherein the power switch is operable in a normal mode in which the first terminal of the power switch is connected to the second terminal of the power switch, and a standby mode in which the first terminal of the power switch is disconnected from the second terminal of the power switch;

wherein when the power switch operates in the normal mode, the output voltage across the first terminal of the power input unit and the second terminal of the power input unit produces a current that flows out of the first terminal of the power input unit, through the phase detector via the first terminal of the phase detector and the second terminal of the phase detector, through the power switch via the first terminal of the power switch and the second terminal of the power switch, and into the second terminal of the power input unit, thereby causing the power input unit to consume power in the normal mode;

wherein when the power switch operates in the standby mode, no current flows out of the first terminal of the power input unit, through the phase detector via the first terminal of the phase detector and the second terminal of the phase detector, through the power switch via the first terminal of the power switch and the second terminal of the power switch, and into the second terminal of the power input unit, so that the power input unit does not consume power in the standby mode;

wherein when the power switch operates in the normal mode, the phase detector detects zero-crossing points of the AC voltage based on the current flowing through the phase detector, and outputs a phase detecting signal when the zero-crossing points of the AC voltage are detected; and wherein when the power switch operates in the standby mode, the phase detector does not detect the zero-crossing points of the AC voltage, and does not output the phase detecting signal.

24. The phase detecting device of claim 23, wherein the power input unit comprises:

a resistor circuit that divides the AC voltage and outputs a divided AC voltage; and a full-wave rectifier that rectifies the divided AC voltage and outputs a rectified AC voltage as the output voltage across the first terminal of the power input unit and the second terminal of the power input unit.

25. The phase detecting device of claim 23, wherein the phase detector comprises a single switching circuit that detects zero-crossing points of both a positive polarity and a negative polarity of the AC voltage.

26. The phase detecting device of claim 23, wherein the power switch switches between the normal mode and the standby mode in response to a mode control signal.

27. The phase detecting device of claim 26, wherein the mode control signal comprises:

a normal mode control signal that controls the power switch to operate in the normal mode; and a standby mode control signal that controls the power switch to operate in the standby mode.

28. The phase detecting device of claim 23, wherein the power switch receives a predetermined voltage in the normal mode, thereby causing the power switch to operate in the normal mode; and wherein the power switch does not receive the predetermined voltage in the standby mode, thereby causing the power switch to operate in the standby mode.

29. The phase detecting device of claim 28, wherein the phase detector receives a predetermined voltage that enables the phase detector to operate;

wherein the predetermined voltage received by the power switch during the normal mode is different from the predetermined voltage received by the phase detector.

30. A phase control device that controls a phase of an AC power supplied to a device, the phase control device comprising:

the phase detecting device of claim 23; and a signal generator that generates a phase control signal to control the phase of the AC power supplied to the device based on the phase detecting signal.

31. A fuser control device that controls an AC power supplied to a fuser of an image forming apparatus, the fuser control device comprising:

the phase detecting device of claim 23;

a signal generator that generates a phase control signal to control a phase of the AC power supplied to the fuser based on the phase detecting signal; and a temperature controller that controls a temperature of the fuser by controlling the phase of the AC power supplied to the fuser according to the phase control signal.

* * * * *

UNITED STATES PATENT AND TRADEMARK OFFICE

CERTIFICATE OF CORRECTION

PATENT NO. : 7,679,354 B2
APPLICATION NO. : 11/734554
DATED : March 16, 2010
INVENTOR(S) : Bong-su Shin It is certified that error appears in the above-identified patent and that said Letters Patent is hereby corrected as shown below:

Column 14, Line 25, change "element" to --element;--.

Column 15, Line 34, after "into" delete "to".

Column 16, Lines 1-22, change

"16. The phase detecting device of claim 15, wherein the phase detector further comprises a 3-terminal element;
wherein the 3-terminal element comprises:
a first terminal that receives a second predetermined DC voltage and is connected to the second photocoupler,
a second terminal that receives the second predetermined DC voltage, and a third terminal that receives a ground voltage; and
wherein the second 3-terminal element
outputs the ground voltage from the second terminal of the 3-terminal element as the phase detecting signal when the zero-crossing points of the AC voltage are detected and the power switch is operating in the normal mode,
outputs the second predetermined DC voltage from the second terminal of the 3-terminal element when the zero-crossing points of the AC voltage are not detected and the power switch is operating in the normal model, and
outputs the ground voltage from the second terminal of the second 3-terminal element when the power switch is operating in the standby mode." to Signed and Sealed this Sixth Day of July, 2010

David J. Kappos
*Director of the United States Patent and Trademark Office*

--16. The phase detecting device of claim 15, wherein the phase detector further comprises a 3-terminal element;

wherein the 3-terminal element comprises:

a first terminal that receives a second predetermined DC voltage and is connected to the second photocoupler, a second terminal that receives the second predetermined DC voltage, and a third terminal that receives a ground voltage; and wherein the second 3-terminal element outputs the ground voltage from the second terminal of the 3-terminal element as the phase detecting signal when the zero-crossing points of the AC voltage are detected and the power switch is operating in the normal mode, outputs the second predetermined DC voltage from the second terminal of the 3-terminal element when the zero-crossing points of the AC voltage are not detected and the power switch is operating in the normal mode, and outputs the ground voltage from the second terminal of the second 3-terminal element when the power switch is operating in the standby mode."

Column 16, Line 55, after "of claim" delete "of claim".